United States Patent
Xu et al.

(10) Patent No.: US 8,440,473 B2
(45) Date of Patent: May 14, 2013

(54) USE OF SPECTRUM TO SYNCHRONIZE RF SWITCHING WITH GAS SWITCHING DURING ETCH

(75) Inventors: Qing Xu, Fremont, CA (US); Camelia Rusu, Pleasanton, CA (US); Brian K. McMillin, Pleasanton, CA (US); Alexander M. Paterson, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 163 days.

(21) Appl. No.: 13/154,075

(22) Filed: Jun. 6, 2011

(65) Prior Publication Data

US 2012/0309198 A1    Dec. 6, 2012

(51) Int. Cl.
*H01L 21/00* (2006.01)

(52) U.S. Cl.
USPC .................. 438/7; 257/E21.529; 118/691

(58) Field of Classification Search .......... 216/59; 427/10; 438/7; 257/E21.529; 118/691; 702/172, 193; 700/121; 356/316
See application file for complete search history.

(56) References Cited

U.S. PATENT DOCUMENTS

| | | | |
|---|---|---|---|
| 5,501,893 A | | 3/1996 | Laermer et al. |
| 5,807,761 A * | | 9/1998 | Coronel et al. ............... 438/14 |
| 6,051,503 A | | 4/2000 | Bhardwaj et al. |
| 6,261,962 B1 | | 7/2001 | Bhardwaj et al. |
| 6,417,013 B1 | | 7/2002 | Teixeira et al. |
| 6,716,758 B1 | | 4/2004 | Donohoe et al. |
| 6,950,178 B2 * | | 9/2005 | Rueger et al. .................. 356/72 |
| 7,135,410 B2 | | 11/2006 | Jacobs et al. |
| 2004/0157457 A1 * | | 8/2004 | Xu et al. ........................ 438/694 |
| 2004/0263827 A1 * | | 12/2004 | Xu et al. ........................ 356/72 |
| 2005/0211873 A1 * | | 9/2005 | Krishna et al. ............... 250/206 |
| 2006/0000799 A1 * | | 1/2006 | Doh et al. ..................... 216/59 |
| 2008/0078504 A1 * | | 4/2008 | Vukovic ................ 156/345.28 |
| 2009/0184089 A1 | | 7/2009 | Chebi et al. |

OTHER PUBLICATIONS

Hopkins, 'The Benefits of Process Parameter Ramping During the Plasma Etching of High Aspect Ratio Silicon Structures,' Materials Research Society, vol. 546, pp. 63-68, 1999.
Kamioka, 'An Ellipsometric Study of the Effects of DC Bias of the Plasma Oxidation of Silicon,' Solid State Communications, vol. 97, No. 6, pp. 531-534, 1996.
U.S. Appl. No. 13/188,174, filed Jul. 21, 2011.

* cited by examiner

*Primary Examiner* — Caridad Everhart
(74) *Attorney, Agent, or Firm* — Beyer Law Group LLP

(57) ABSTRACT

A method for etching features into an etch layer in a plasma processing chamber is provided. An optically timed deposition phase is provided comprising providing a flow of deposition phase gas, detecting the presence of deposition gas within the plasma processing chamber, providing RF energy for forming a plasma from the deposition phase gas in the plasma processing chamber, and stopping the flow of the deposition gas into the plasma processing chamber. An optically timed etching phase is provided, comprising providing a flow of an etch gas, detecting the presence of the etch gas within the plasma processing chamber, providing RF energy for forming a plasma from the etch gas in the plasma processing chamber, and stopping the flow of the etch gas into the plasma processing chamber.

19 Claims, 7 Drawing Sheets

USE OF SPECTRUM TO SYNCHRONIZE RF SWITCHING WITH GAS SWITCHING DURING ETCH

BACKGROUND OF THE INVENTION

1. Field of the Invention

The invention relates to a method of obtaining a structure on a semiconductor wafer by etching an etch layer.

2. Description of the Related Art

In forming semiconductor devices on a substrate an etch layer is etched. The etch layer may be part of the substrate or a layer above the substrate. The etching may occur in a plasma processing chamber.

SUMMARY OF THE INVENTION

To achieve the foregoing and in accordance with the purpose of the present invention, a method for etching features into an etch layer in a plasma processing chamber is provided. An optically timed deposition phase is provided comprising providing a flow of deposition phase gas, detecting the presence of deposition gas within the plasma processing chamber, providing RF energy for forming a plasma from the deposition phase gas in the plasma processing chamber, and stopping the flow of the deposition gas into the plasma processing chamber. An optically timed etching phase is provided, comprising providing a flow of etch phase gas, detecting the presence of the etch gas within the plasma processing chamber, providing RF energy for forming a plasma from the etch gas in the plasma processing chamber, and stopping the flow of the etch gas into the plasma processing chamber.

In another manifestation of the invention a method for providing an optically timed gas modulated semiconductor process in a plasma processing chamber is provided, comprising a plurality of cycles where each cycle comprises a first optically timed phase and a second optically timed phase.

In another manifestation of the invention an apparatus for etching an etch layer is provided. A plasma processing chamber is provided, comprising a chamber wall forming a plasma processing chamber enclosure, a substrate support for supporting a wafer within the plasma processing chamber enclosure, a pressure regulator for regulating the pressure in the plasma processing chamber enclosure, at least one electrode for providing power to the plasma processing chamber enclosure for sustaining a plasma, a gas inlet for providing gas into the plasma processing chamber enclosure, and a gas outlet for exhausting gas from the plasma processing chamber enclosure. A spectrometer is positioned to measure light from inside the plasma processing chamber. At least one RF power source is electrically connected to the at least one electrode. A gas source is in fluid connection with the gas inlet and comprises a deposition gas source and an etch gas source. A controller is controllably connected to the gas source, the spectrometer; and the at least one RF power source. The controller comprises at least one processor and computer readable media. The computer readable media comprises computer readable code for etching the etch layer comprising a plurality of cycles, wherein each cycle comprises computer readable code for providing an optically timed deposition phase, comprising computer readable code for providing a flow of deposition gas, computer readable code for using the spectrometer to detect the presence of deposition gas within the plasma processing chamber, computer readable code for providing RF energy for forming a plasma from the deposition gas in the plasma processing chamber, and computer readable code for stopping the flow of the deposition into the plasma processing chamber and computer readable code for providing an optically timed etch phase, comprising computer readable code for providing a flow of an etch gas, computer readable code for using the spectrometer to detect the presence of etch gas within the plasma processing chamber, computer readable code for providing RF energy for forming a plasma from the etch gas in the plasma processing chamber, and computer readable code for stopping the flow of the etch gas into the plasma processing chamber.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
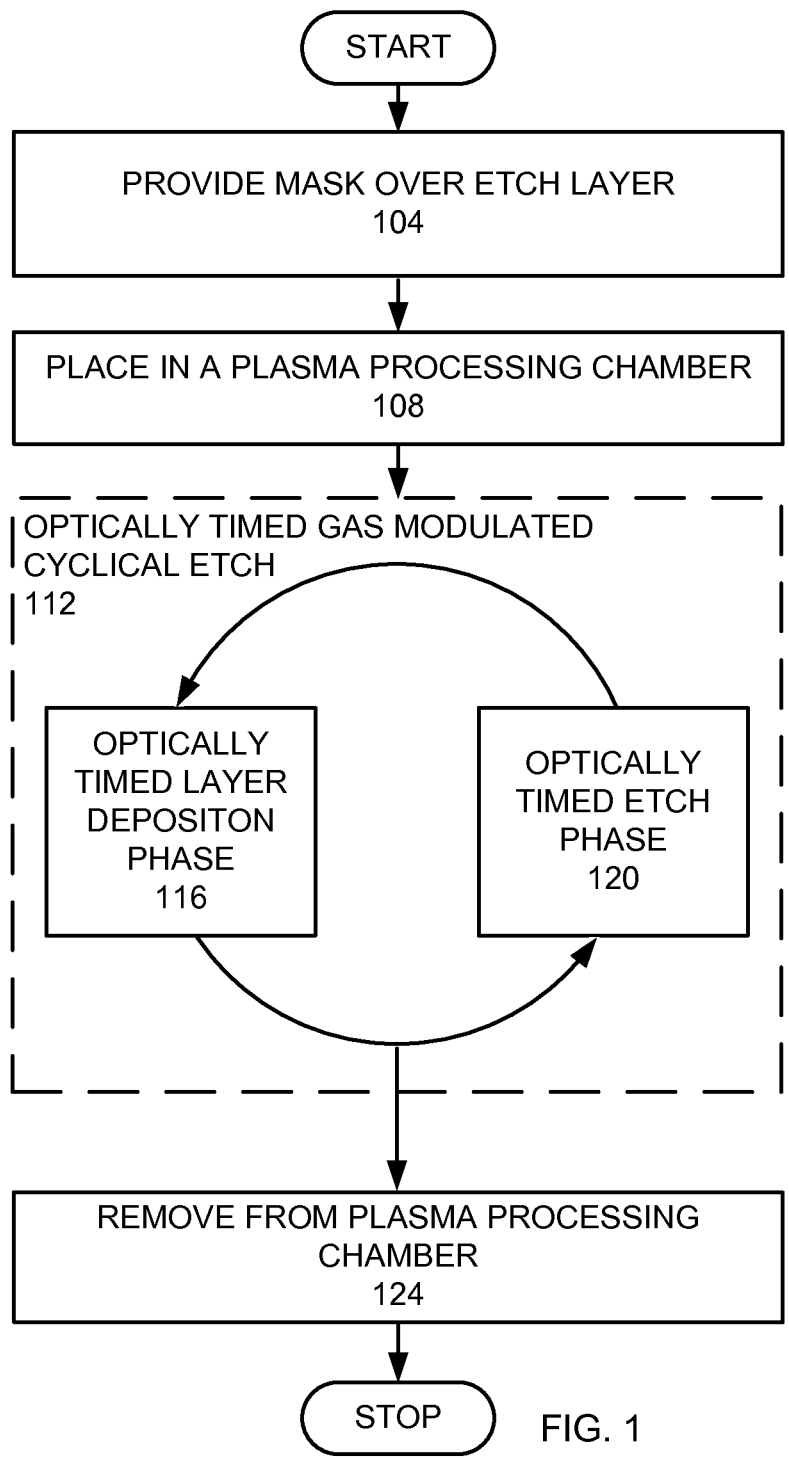
FIG. 1 is a flow chart of an embodiment of the invention.

FIG. 1 is a high level flow chart of an embodiment of the invention. In this embodiment, a patterned mask is formed over an etch layer on a substrate (step 104). The etch layer may be part of the substrate, such as a silicon layer of a silicon wafer or may be a layer over the substrate, such as a dielectric or conductive layer. The etch layer over the substrate is placed in a plasma processing chamber (step 108). The etch layer is subjected to an optically timed gas modulated cyclical etch (step 112). The optically timed gas modulated cyclical etch comprises a plurality of cycles, where each cycle comprises an optically timed layer deposition phase (step 116) and an optically timed etch phase (step 120). The wafer is then removed from the plasma processing chamber (step 124).

Figure 2A:
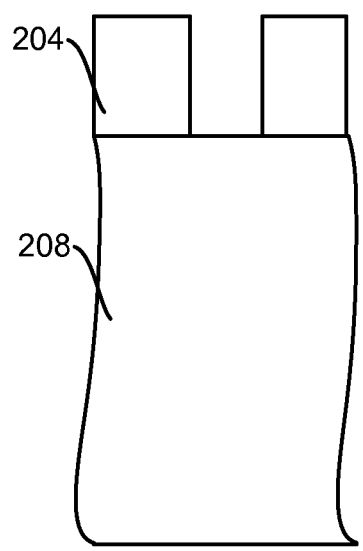
FIGS. 2A-D are schematic views of the formation of a feature using the inventive process.

In a preferred embodiment of the invention, the features to be etched are through semiconductor wafer vias (TSVs). In this embodiment, the mask is a photoresist mask patterned on a silicon wafer (step 104). FIG. 2A is a schematic cross-sectional view of a silicon wafer 208, over which a patterned organic mask 204 has been formed. One or more intermediate patterning layers, such as an antireflective coating (ARC) may be disposed between the silicon wafer (substrate) 208 and the patterned organic mask 204 to improve the mask patterning process.

Figure 3:
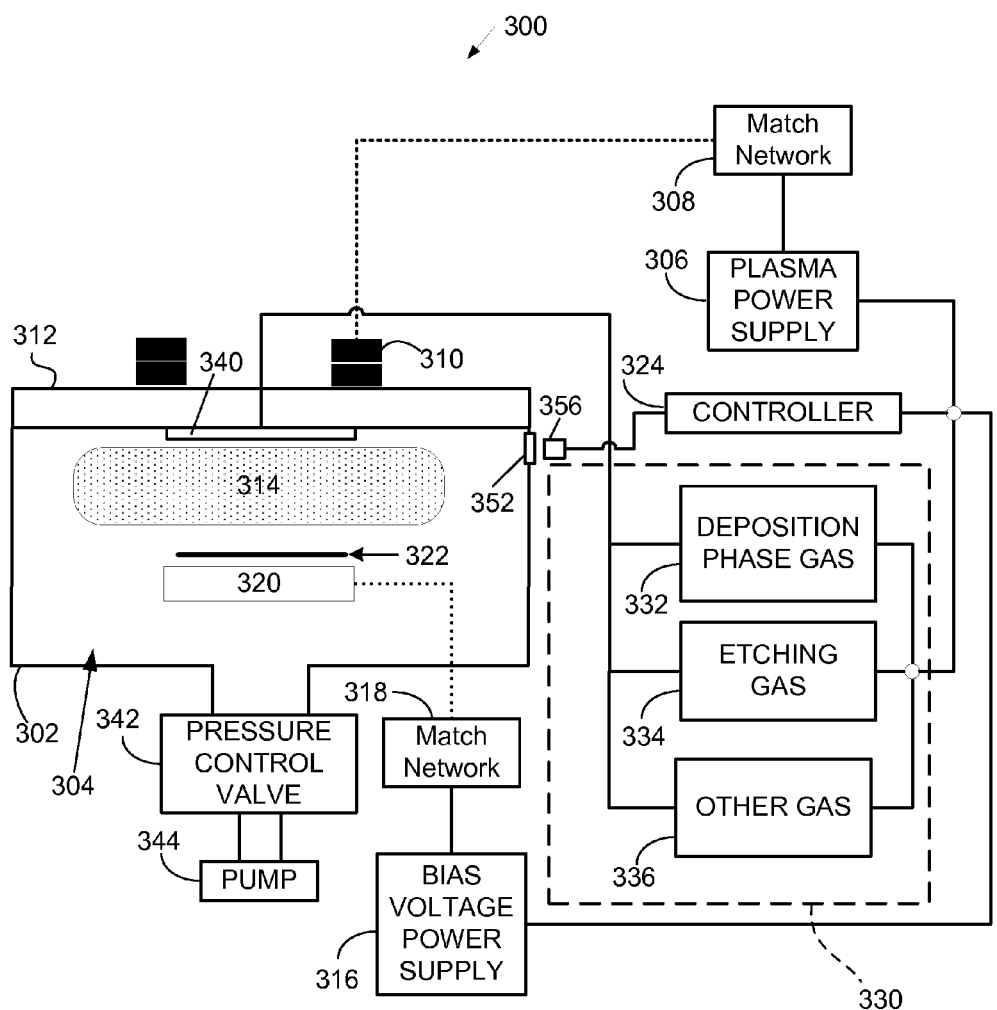
FIG. 3 is a schematic view of a plasma processing chamber that may be used in an embodiment of the invention.

The substrate is placed in a processing tool (step 108). FIG. 3 schematically illustrates an example of a plasma processing system 300 which may be used to perform the process of etching a silicon wafer in accordance with one embodiment of the present invention. The plasma processing system 300 includes a plasma reactor 302 having a plasma processing chamber 304 therein. A plasma power supply 306, tuned by a match network 308, supplies power to a TCP coil 310 located near a power window 312 to create a plasma 314 in the plasma processing chamber 304. The TCP coil (upper power source) 310 may be configured to produce a uniform diffusion profile within processing chamber 304. For example, the TCP coil 310 may be configured to generate a toroidal power distribution in the plasma 314. The power window 312 is provided to separate the TCP coil 310 from the plasma chamber 304 while allowing energy to pass from the TCP coil 310 to the plasma chamber 304. A wafer bias voltage power supply 316 tuned by a match network 318 provides power to an electrode 320 to set the bias voltage on a wafer 322 which is supported by the electrode 320. A controller 324 sets points for the plasma power supply 306 and the wafer bias voltage supply 316.

The plasma power supply 306 and the wafer bias voltage power supply 316 may be configured to operate at specific radio frequencies such as, for example, 13.56 MHz, 27 MHz, 2 MHz, 400 kHz, or combinations thereof. Plasma power supply 306 and wafer bias power supply 316 may be appropriately sized to supply a range of powers in order to achieve desired process performance. For example, in one embodiment of the present invention, the plasma power supply 306 may supply the power in a range of 300 to 10000 Watts, and the wafer bias voltage power supply 316 may supply a bias voltage of in a range of 10 to 1000 V. In addition, the TCP coil 310 and/or the electrode 320 may be comprised of two or more sub-coils or sub-electrodes, which may be powered by a single power supply or powered by multiple power supplies.

As shown in FIG. 3, the plasma processing system 300 further includes a gas source/gas supply mechanism 330. The gas source includes a deposition phase gas source 332, an etching phase gas source 334, and optionally, an additional gas source 336. The gas sources 332, 334, and 336 are in fluid connection with processing chamber 304 through a gas inlet, such as a shower head 340. The gas inlet may be located in any advantageous location in chamber 304, and may take any form for injecting gas. Preferably, however, the gas inlet may be configured to produce a "tunable" gas injection profile, which allows independent adjustment of the respective flow of the gases to multiple zones in the process chamber 304. The process gases and byproducts are removed from the chamber 304 via a pressure control valve 342 and a pump 344, which also serve to maintain a particular pressure within the plasma processing chamber 304. The gas source/gas supply mechanism 330 is controlled by the controller 324. A 2300 Syndion by Lam Research Corp. may be used to practice an embodiment of the invention. To this device, and optical window 352 is added. An optical spectrometer 356 is positioned to measure light from the plasma that passes through the optical window 352. Output from the optical spectrometer 356 is provided to the controller.

Figure 4:
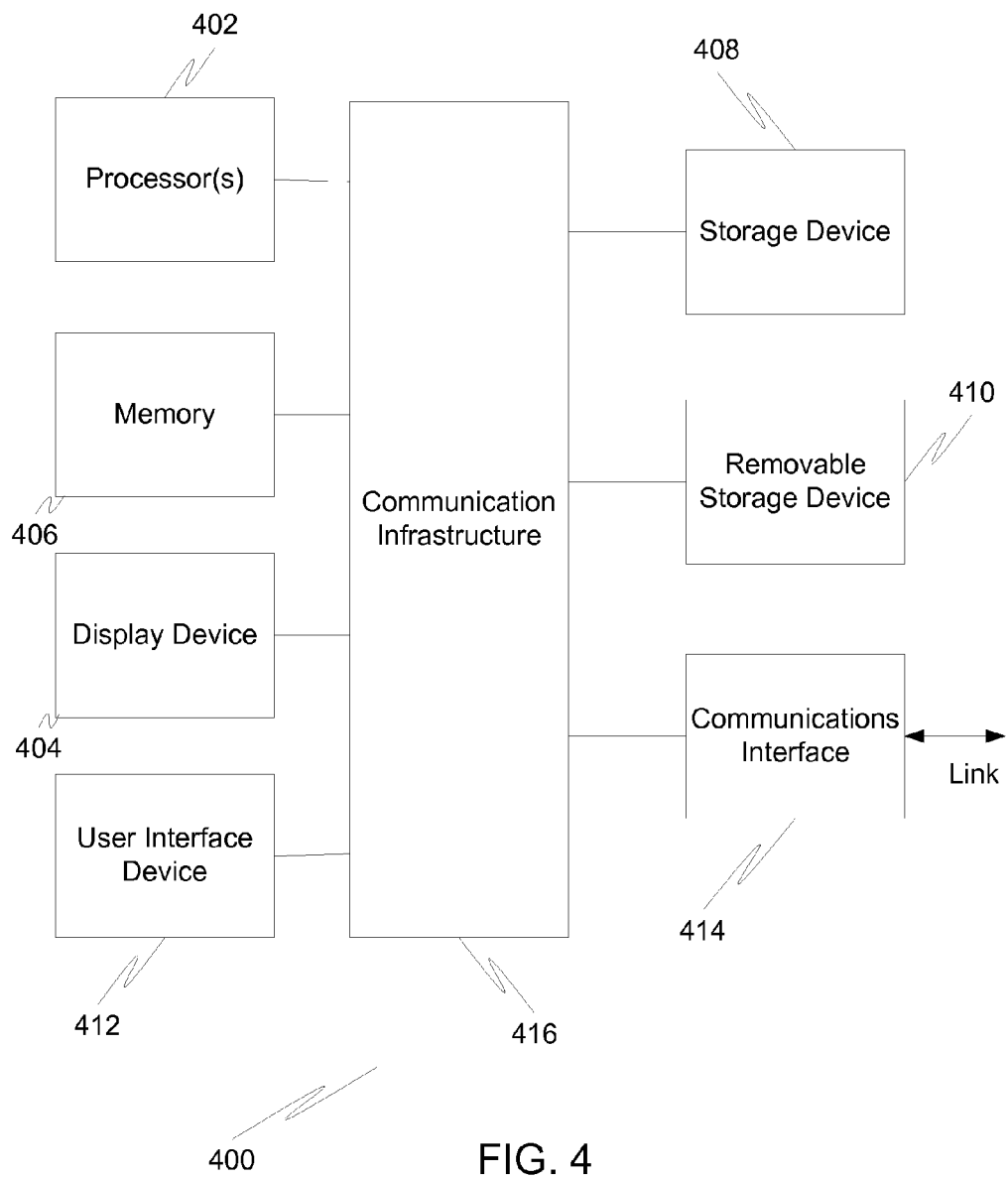
FIG. 4 is a schematic view of a computer system that may be used in practicing the invention.

FIG. 4 is a high level block diagram showing a computer system 400, which is suitable for implementing a controller 324 used in embodiments of the present invention. The computer system may have many physical forms ranging from an integrated circuit, a printed circuit board, and a small handheld device up to a huge super computer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 2B:
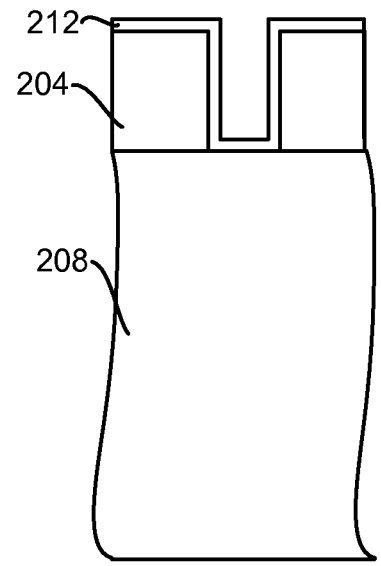
Figure 5:
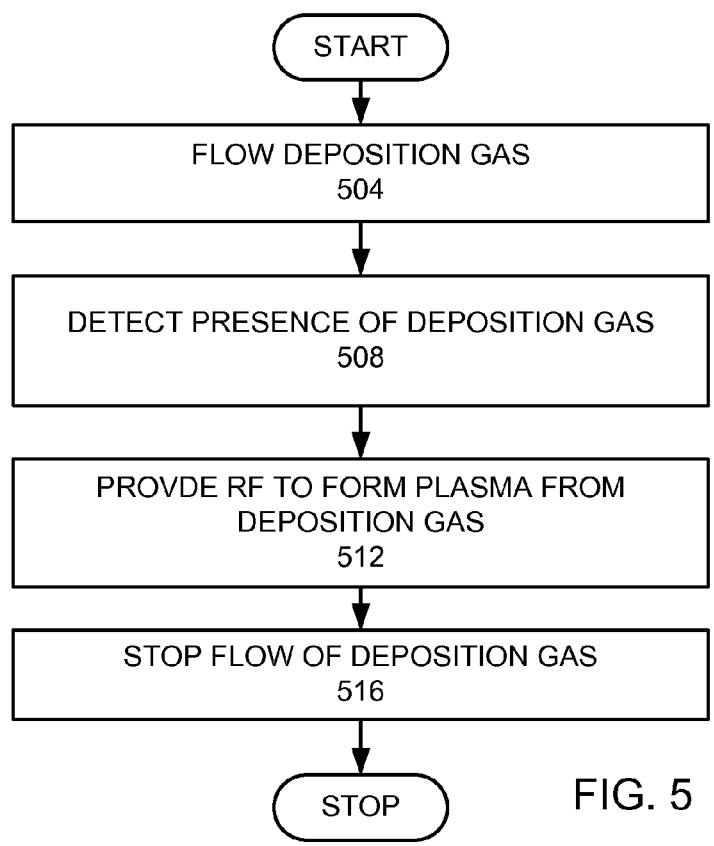
FIG. 5 is a more detailed flow chart of the optically timed deposition phase.

The etch layer is subjected to an optically timed gas modulated cyclical etch (step 112). The optically timed gas modulated cyclical etch comprises a plurality of cycles, where each cycle comprises an optically timed layer deposition phase (step 116) and an optically timed etch phase (step 120). FIG. 5 is a more detailed flow chart of the optically timed layer deposition phase. A deposition gas is flowed into the plasma processing chamber 304 (step 504). The presence of the deposition gas is detected (step 508). RF is provided to form the deposition gas into a plasma (step 512). Other deposition parameters that may be instantly switched, such as deposition pressure, may also be provided at this time. The flow of the deposition gas is stopped (step 516). FIG. 2B is a cross-sectional view of the silicon wafer 208 and mask 204 after a deposition layer 212 has been formed during the optically timed deposition phase (step 116).

An example of a deposition recipe provides a flow of 100 sccm $C_4F_8$ to the plasma pressure chamber. When the presence of $C_4F_8$ is detected in the plasma processing chamber, a pressure of 100 mTorr, a bias of 200 volts, and 2000 Watts of RF are provided.

Figure 2C:
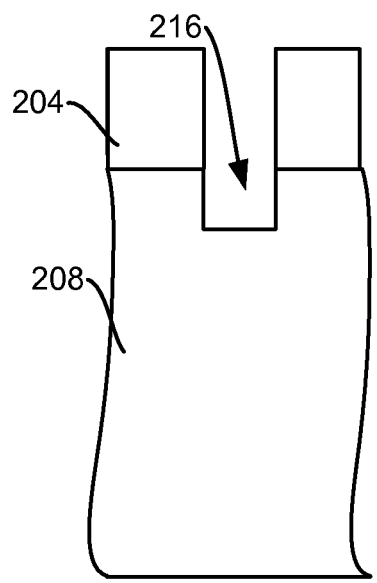
Figure 2D:
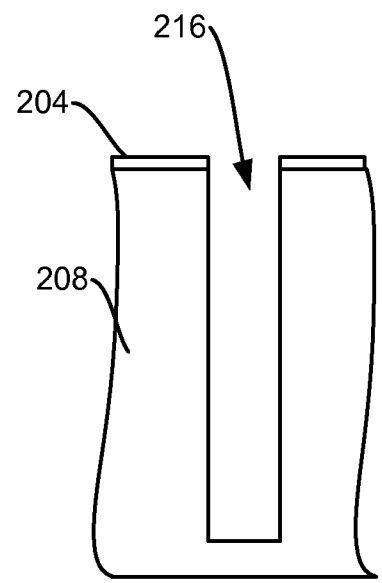
Figure 6:
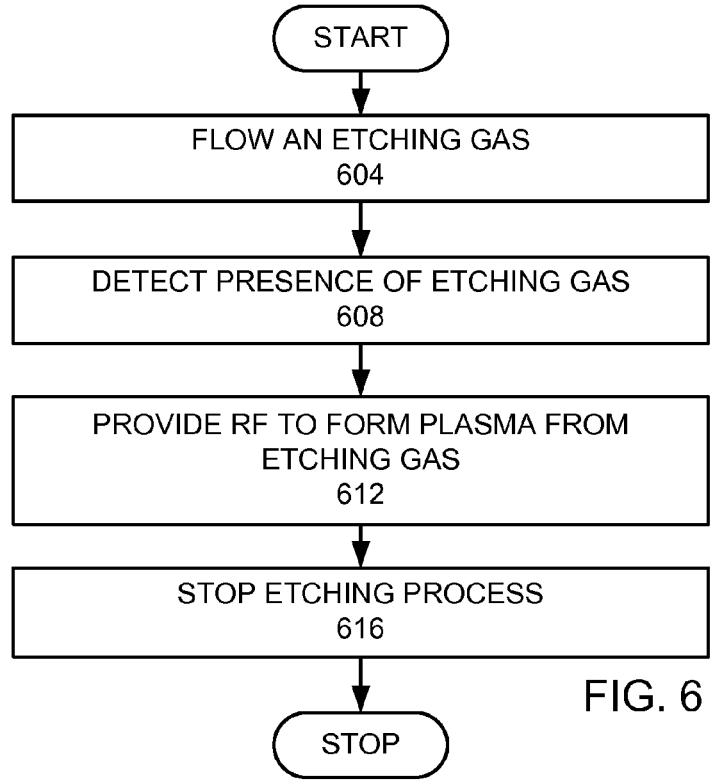
FIG. 6 is a more detailed flow chart of the optically timed etch phase.

FIG. 6 is a more detailed flow chart of the optically timed etch phase (step 120). An etch gas is flowed into the plasma processing chamber 304 (step 604). The presence of the etch gas is detected (step 608). RF is provided to form the etch gas into a plasma (step 612). Other etch parameters that may be instantly switched, such as etch pressure, may also be provided at this time. The flow of the etch gas is stopped (step 616). FIG. 2C is a cross-sectional view of the silicon wafer 208 and mask 204 after an optically timed etch phase (step 120), which forms part of the etch feature 216. FIG. 2D is a cross-sectional view of the silicon wafer 208 and mask 204 after the etch feature 216 is almost completely etched.

An example of an etch recipe provides a flow of 150 sccm $SF_6$ to the plasma process chamber. When the presence of $SF_6$ is detected in the plasma processing chamber, a pressure of 120 mTorr a bias of 150 volts, and 2300 Watts of RF power are provided to the plasma processing chamber.

Figure 7:
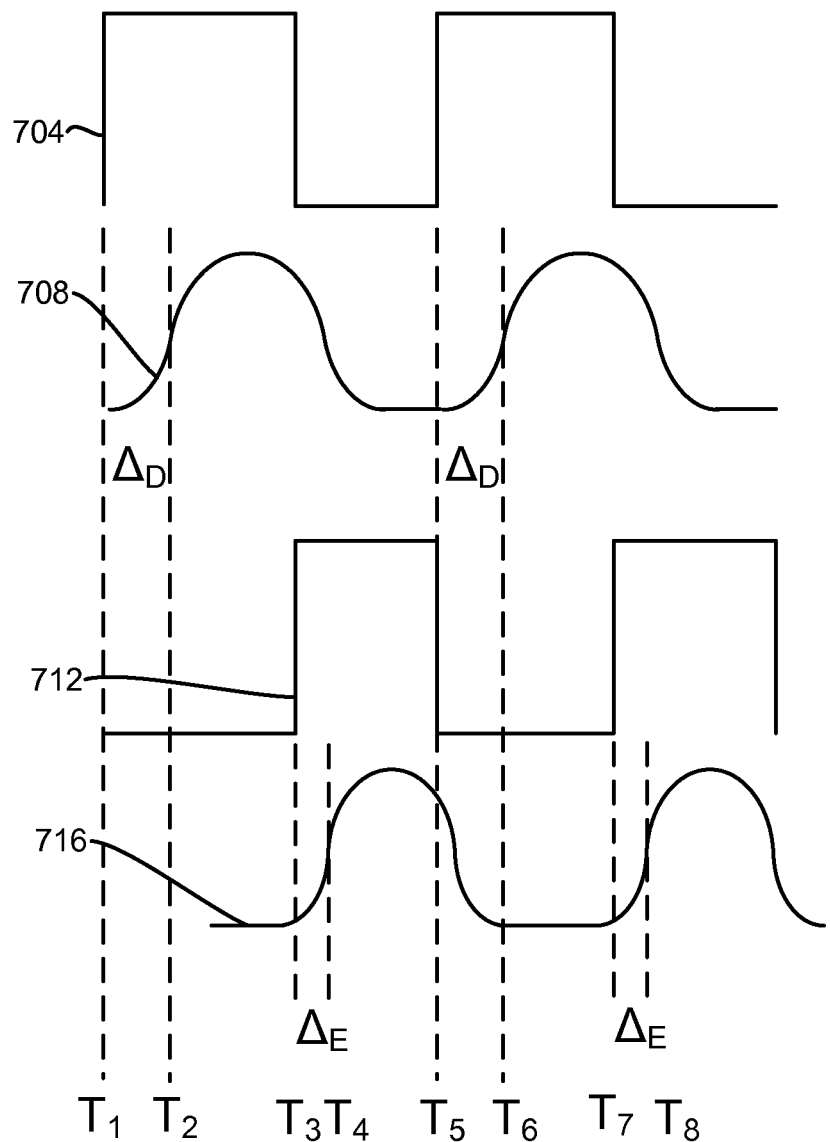
FIG. 7 illustrates the timing of a gas modulation process.

The invention provides increased etch efficiency, which allows for faster etching and more efficient use of resources, reducing required energy and waste of gases. To illustrate the increased etch efficiency, FIG. 7 is a graph illustrating a gas modulation process. In this example of gas modulation, a deposition phase is followed by an etch phase. At time $T_1$ the deposition phase begins. Line 704 shows the application of RF power, pressure, and other parameters that may be switched almost instantaneously for the deposition phase. Line 708 shows the application of deposition gas, which is not able to be switched almost instantaneously, but instead is switched over a substantial period of time. Line 712 shows the application of RF power, pressure, and other parameters that may be switched almost instantaneously for the etch phase. Line 716 shows the application of etch gas, which is not able to be switched almost instantaneously, but instead is switched over a substantial period of time. Therefore in FIG. 7, the deposition gas flow reaches half of the maximum gas flow at $T_2$, so that a time lag of $\Delta_D$ is the time between when the deposition RF and pressure is provided and the time that the deposition gas flow reaches half of the maximum deposition gas flow. In an example, the deposition phase is between 100 ms to 2 seconds, where the time lag $\Delta_D$ may be from 50 ms to 2 seconds, depending on the chamber design and the gas flow rate. At time $T_3$ the etch phase begins. The etch gas flow reaches half of the maximum gas flow at $T_4$, so that a time lag of $\Delta_E$ is the time between when the etch RF and pressure is provided and the time that the etch gas flow reaches half of the maximum etch gas flow. In an example, the etch phase is between 100 ms to 2 seconds, where the time lag $\Delta_E$ may be from 50 ms to 2 seconds. In this example the time lag for the deposition $\Delta_D$ phase is different from the time lag for the etch phase $\Delta_E$. Although the time lag may be machine dependent, the time lag may also be dependent on the gas flow rates. This difference of time lags for different processes means that using a simple set delay in the RF based on the machine used will not work since as shown in the examples, different processes cause different delays. It is believed that actual process using the method in this example without optically timed delays have inefficiencies of 10% to 50% where the percentage is the percent of a cycle where only one of the phase RF or phase gas is present but not both the phase RF and phase gas are present.

Figure 8:
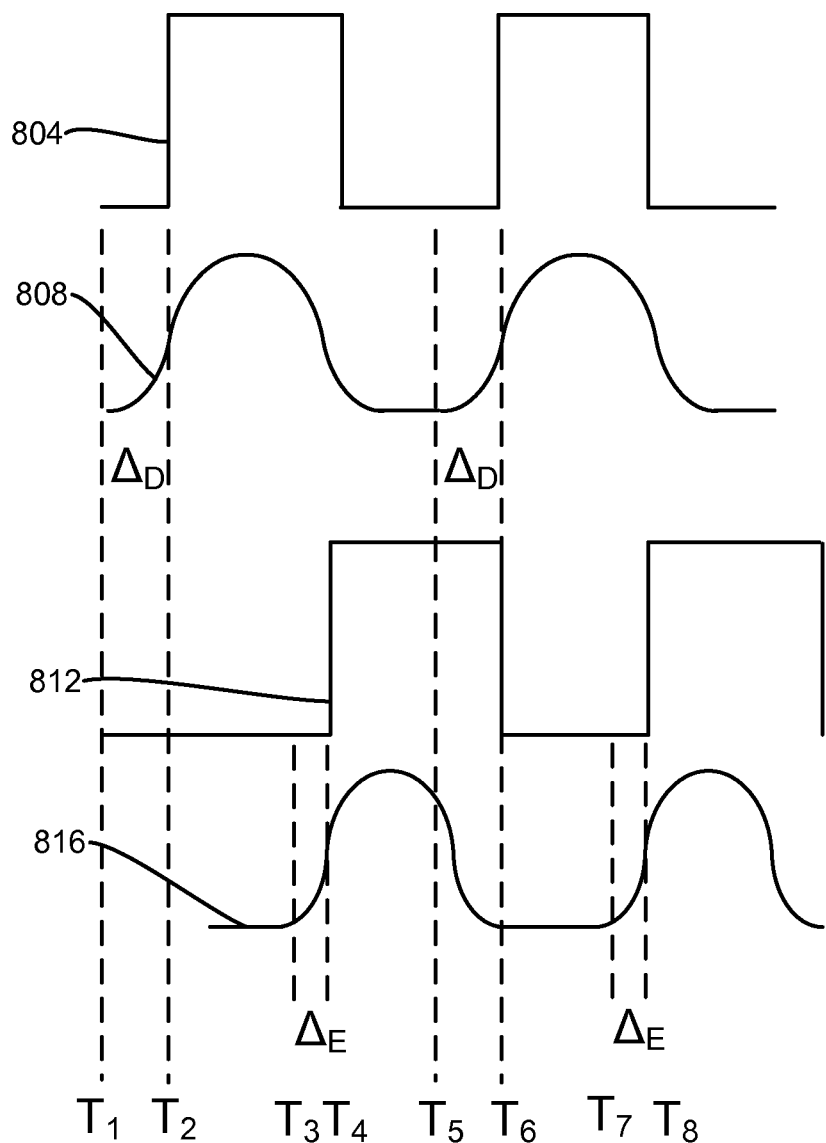
FIG. 8 illustrates the timing of an optically timed gas modulation process according to an embodiment of the invention.

FIG. 8 illustrates how the invention provides an optically timed delay of RF power, pressure, and other parameters, which may be switched almost instantaneously. FIG. 8 is a graph illustrating a gas modulation process in a preferred embodiment of the invention. In this example of gas modulation, a deposition phase is followed by an etch phase. At time $T_1$ the deposition phase begins. Line 804 shows the application of RF power, pressure, and other parameters that may be switched almost instantaneously for the deposition phase. Line 808 shows the application of deposition gas, which is not able to be switched almost instantaneously, but instead is switched over a substantial period of time. Line 812 shows the application of RF power, pressure, and other parameters that may be switched almost instantaneously for the etch phase. Line 816 shows the application of etch gas, which is not able to be switched almost instantaneously, but instead is switched over a substantial period of time. An optically timed delay $\Delta_D$ of deposition RF power and other parameters allows these parameters to be provided at time $T_2$, when the deposition gas flow reaches half of the maximum gas flow. An optically timed delay $\Delta_E$ of etch RF power and other parameters allows these parameters to be provided at time $T_4$, when the etch gas flow reaches half of the maximum gas flow. In this embodiment, the end of each phase may be delayed. In this example, the delay of the end of each phase is until the start of the next phase. In other embodiments, the end of each phase may not be delayed. By providing the delay, during a greater part of the period when the deposition power and other parameters are provided, the deposition gas is present in the plasma processing chamber and during a greater part of the period when the etch power and other parameters are provided, the etch gas is present in the plasma processing chamber, when compared to a process without the delay. In this example, for each cycle both the gas for a phase and the other parameters, such as power, for the phase are both present from 80% to 100% of the cycle.

In an example the etch phase is between 100 ms to 2 seconds, where the time lag $\Delta_E$ may be from 100 ms to 2 seconds. In this example the time lag for the deposition $\Delta_D$ phase is different from the time lag for the etch phase $\Delta_E$. Although the time lag may be machine dependent, the time lag may also be dependent on the gas flow rates. This difference of time lags for different processes means that a using a simple set delay in the RF based on the machine used will not work since as shown in the examples, different processes cause different delays. More preferably, the optically timed delay is between 50 ms to 400 ms. Preferably, the cycles are repeated at least 3 times. More preferably the cycles are repeated at least 100 times.

In one embodiment of the invention, the optical detection occurs in real time, as gases are detected by the optical spectrometer, a signal is provided to provide the RF or other related parameters. Such real time delays are optically timed, in that detection by the optical spectrometer provides the signal to provide the power switching.

In another embodiment of the invention, the optical detection may be recorded by a controller and is used to modify a recipe which provides a time delay for the deposition phase and a different time delay for the etch phase. The time delays are then used during processing. Such recipe time delays are optically timed in that the optical spectrometer detection of the etch or deposition gas is used to provide the delays in the recipe.

The optical spectrometer is a spectrometer that measures frequency of light in order to determine gas components.

In an embodiment of the invention, the delay may change over time. For example the time lag for deposition may increase or decrease over time as a chamber parameter drifts over time or a process parameter ramps over time. An optically timed delay provides a delay that accounts for the drift. A real time optically timed delay would provide improved compensation for fluctuating delays.

In an embodiment where the silicon wafer is the etch layer, the silicon wafer may be etched completely through to form through silicon vias. In an embodiment where the etch layer is a dielectric layer, the plasma processing chamber may provide capacitive coupling instead of inductive coupling. In another embodiment, the etch layer may be a conductive layer.

More generally, the invention provides a semiconductor process that comprises a plurality of cycles of two or more optically timed phases such as an optically timed deposition phase and an optically timed etch phase, or an optically timed etch phase and an optically timed etch phased, or an optically timed deposition phase and an optically timed deposition phase, or a plurality of optically timed deposition phases and a plurality of optically timed etch phases. Such a process provides a first optically timed phase followed by a second optically timed phase. In such an example the first optically timed phase flows a first gas into the plasma processing chamber, detects a presence of the first gas using a spectrometer placed to receive light from the plasma processing chamber, and provides a first RF output when the presence of the first gas is detected and the second optically timed phase flows a second gas different from the first gas into the plasma processing chamber, detects a presence of the second gas using the spectrometer placed to receive light from the plasma processing chamber, and provides a second RF output different from the first RF output when the presence of the second gas is detected. Optionally a third or more optically timed phases can follow with different gases or different RF energy in the same manner. Preferably this cycle is repeated at least three times. More preferably, this cycle is repeated at least 100 times.

While this invention has been described in terms of several preferred embodiments, there are alterations, permutations, and substitute equivalents, which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. A method for etching features into an etch layer in a plasma processing chamber, comprising a plurality of cycles, wherein each cycle comprises:
   an optically timed deposition phase, comprising:
      providing a flow of deposition phase gas;
      detecting the presence of deposition gas within the plasma processing chamber;
      providing RF energy for forming a plasma from the deposition phase gas in the plasma processing chamber; and
      stopping the flow of the deposition gas into the plasma processing chamber; and
   an optically timed etching phase, comprising:
      providing a flow of an etch gas;
      detecting the presence of the etch gas within the plasma processing chamber;
      providing RF energy for forming a plasma from the etch gas in the plasma processing chamber; and
      stopping the flow of the etch gas into the plasma processing chamber.

2. The method, as recited in claim 1, wherein the detecting the presence of the deposition gas and the detecting the presence of the etch gas uses a spectrometer placed to receive light from the plasma processing chamber.

3. The method, as recited in claim 2, wherein a controller receives input from the spectrometer and controls RF sources.

4. The method, as recited in 3, wherein the controller in real time causes the RF sources to provide a deposition RF power output when the spectrometer indicates the presence of a deposition gas.

5. The method, as recited in claim 3, wherein the controller records a time delay for providing a flow of the deposition phase gas and modifies a recipe to provide a time delay for providing RF energy for forming a plasma from the deposition phase gas based on the recorded time delay for providing a flow of the deposition gas, and wherein the controller records a time delay for providing a flow of the etch phase gas and modifies the recipe to provide a time delay for providing RF energy for forming a plasma from the etch phase gas based on the recorded time delay for providing a flow of the etch gas.

6. The method, as recited in 4, wherein the controller in real time causes the RF sources to provide an etch RF power output when the spectrometer indicates the presence of an etch gas.

7. The method, as recited in claim 6, wherein the deposition phase is from 100 ms to 2 seconds and wherein the etch phase is from 100 ms to 2 seconds.

8. The method, as recited in claim 7, wherein the plurality of cycles comprises at least three cycles.

9. The method, as recited in claim 7, wherein the plurality of cycles comprises at least 100 cycles.

10. The method, as recited in claim 9, wherein the etch layer is a silicon wafer, and wherein the features are vias.

11. A method for providing an optically timed gas modulated semiconductor process in a plasma processing chamber, comprising a plurality of cycles, wherein each cycle comprises:
   a first optically timed phase; and
   a second optically timed phase.

12. The method, as recited in claim 11, wherein the first optically timed phase flows a first gas into the plasma processing chamber, detects a presence of the first gas using a spectrometer placed to receive light from the plasma processing chamber, and provides a first RF output when the presence of the first gas is detected and wherein the second optically timed phase flows a second gas different from the first gas into the plasma processing chamber, detects a presence of the second gas using the spectrometer placed to receive light from the plasma processing chamber, and provides a second RF output different from the first RF output when the presence of the second gas is detected.

13. The method, as recited in claim 12, wherein a controller receives input from the spectrometer and controls at least one RF source.

14. The method, as recited in 13, wherein the controller in real time causes the at least one RF source to provide the first RF power output when the spectrometer indicates the presence of the first gas.

15. The method, as recited in 14, wherein the controller in real time causes the at least one RF source to provide the second RF power output when the spectrometer indicates the presence of the second gas.

16. The method, as recited in claim 15, wherein the first phase is from 100 ms to 2 seconds and wherein the second phase is from 100 ms to 2 seconds.

17. The method, as recited in claim 16, wherein the plurality of cycles comprises at least 100 cycles.

18. An apparatus for etching an etch layer, comprising:
   a plasma processing chamber, comprising:
      a chamber wall forming a plasma processing chamber enclosure;
      a substrate support for supporting a wafer within the plasma processing chamber enclosure;

a pressure regulator for regulating the pressure in the plasma processing chamber enclosure;
at least one electrode for providing power to the plasma processing chamber enclosure for sustaining a plasma;
a gas inlet for providing gas into the plasma processing chamber enclosure; and
a gas outlet for exhausting gas from the plasma processing chamber enclosure;
a spectrometer positioned to measure light from inside the plasma processing chamber;
at least one RF power source electrically connected to the at least one electrode;
a gas source in fluid connection with the gas inlet, comprising:
a deposition gas source; and
an etch gas source; and
a controller controllably connected to the gas source, the spectrometer; and the at least one RF power source, comprising:
at least one processor; and
computer readable media, comprising:
computer readable code for etching the etch layer comprising a plurality of cycles, wherein each cycle comprises:
computer readable code for providing an optically timed deposition phase, comprising:
computer readable code for providing a flow of deposition gas;
computer readable code for using the spectrometer to detect the presence of deposition gas within the plasma processing chamber;
computer readable code for providing RF energy for forming a plasma from the deposition gas in the plasma processing chamber; and
computer readable code for stopping the flow of the deposition into the plasma processing chamber; and
computer readable code for providing an optically timed etch phase, comprising;
computer readable code for providing a flow of an etch gas;
computer readable code for using the spectrometer to detect the presence of etch gas within the plasma processing chamber;
computer readable code for providing RF energy for forming a plasma from the etch gas in the plasma processing chamber; and
computer readable code for stopping the flow of the etch gas into the plasma processing chamber.

19. The apparatus, as recited in claim 18, wherein the computer readable code for providing RF energy for forming the plasma from the deposition gas comprises computer readable code for in real time causing the at least one RF source to provide a deposition RF power output when the spectrometer indicates the presence of the deposition gas and wherein the computer readable code for providing RF energy for forming the plasma from the etch gas comprises computer readable code for in real time causing the at least one RF source to provide an etch RF power output when the spectrometer indicates the presence of the etch gas.

* * * * *